(12) United States Patent
Kang et al.

(10) Patent No.: US 9,773,823 B2
(45) Date of Patent: Sep. 26, 2017

(54) DISPLAY DEVICE AND METHOD OF MANUFACTURING THE SAME

(71) Applicant: Samsung Display Co., Ltd., Yongin-si, Gyeonggi-do (KR)

(72) Inventors: Su-Hyoung Kang, Bucheon-si (KR); Gwang Min Cha, Cheongju-si (KR); Chang Oh Jeong, Suwon-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/949,510

(22) Filed: Nov. 23, 2015

(65) Prior Publication Data

US 2016/0315227 A1  Oct. 27, 2016

(30) Foreign Application Priority Data

Apr. 21, 2015  (KR) .................. 10-2015-0056032

(51) Int. Cl.
*H01L 27/12* (2006.01)
*H01L 21/768* (2006.01)

(52) U.S. Cl.
CPC ...... *H01L 27/1288* (2013.01); *H01L 21/7688* (2013.01); *H01L 27/1218* (2013.01); *H01L 27/1248* (2013.01); *H01L 27/1259* (2013.01); *H01L 27/1266* (2013.01)

(58) Field of Classification Search
CPC ............. H01L 27/1288; H01L 27/1218; H01L 27/1296; H01L 27/1214; H01L 27/1248; H01L 27/1266; H01L 27/1269; H01L 21/76588; H01L 2224/27001; H01L 2224/80006

See application file for complete search history.

(56) References Cited

U.S. PATENT DOCUMENTS

| | | | |
|---|---|---|---|
| 8,409,941 B2 | 4/2013 | Yin et al. | |
| 8,575,037 B2 | 11/2013 | Friza et al. | |
| 2006/0063309 A1* | 3/2006 | Sugiyama | ........... H01L 21/7806 438/118 |
| 2007/0254456 A1* | 11/2007 | Maruyama | ....... G06K 19/07749 438/458 |

(Continued)

FOREIGN PATENT DOCUMENTS

| | | |
|---|---|---|
| JP | 4602035 B2 | 10/2010 |
| JP | 2013-153177 A | 8/2013 |
| JP | 5433598 B2 | 12/2013 |

*Primary Examiner* — Galina Yushina
(74) *Attorney, Agent, or Firm* — Knobbe, Martens, Olson & Bear LLP

(57) ABSTRACT

A display device and a method of manufacturing the display device are disclosed. In one aspect, the method includes forming a sacrificial layer over a carrier substrate, forming a passivation barrier layer to cover upper and lateral sides of the sacrificial layer and forming a thin film transistor layer over the passivation barrier layer. The method also includes placing a mask over the thin film transistor layer so as to expose an edge portion of the passivation barrier layer, wherein the edge portion does not overlap the mask in the depth dimension of the display device. The method further includes removing the edge portion of the passivation barrier layer so as to form a barrier layer and separating the carrier substrate from the barrier layer via the sacrificial layer.

16 Claims, 5 Drawing Sheets

(56) References Cited

U.S. PATENT DOCUMENTS

| | | | |
|---|---|---|---|
| 2008/0176046 A1* | 7/2008 | Yamaguchi | B81C 3/008 428/195.1 |
| 2009/0004772 A1* | 1/2009 | Jinbo | H01L 29/66969 438/99 |
| 2014/0051192 A1* | 2/2014 | Lee | H01L 51/56 438/26 |
| 2014/0306288 A1* | 10/2014 | Adachi | H01L 27/1218 257/347 |
| 2014/0322899 A1 | 10/2014 | Hong et al. | |
| 2015/0123106 A1* | 5/2015 | Yasumoto | B32B 43/006 257/40 |
| 2015/0287660 A1* | 10/2015 | Watanabe | G06K 19/07722 257/790 |

\* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2015-0056032 filed in the Korean Intellectual Property Office on Apr. 21, 2015, the entire contents of which are incorporated herein by reference.

BACKGROUND

Field

The described technology generally relates to a display device and a method of manufacturing the same.

Description of the Related Technology

A display device, such as a liquid crystal display (LCD), an organic light-emitting diode (OLED) display, and an electrophoretic display, includes an electric field generating electrode and an electro-optical active layer. For example, an OLED includes an organic emission layer as the electro-optical active layer, and the field generating electrode is connected to a switch such as a thin film transistor to receive a data signal, and the electro-optical active layer converts the data signal to an optical signal to display an image.

OLED displays have favorable characteristics such as low power consumption, rapid response rate, high viewing angles, and high contrast ratio.

rather than using color filters as with LCD technologies, the display device includes sets of multi-color self-emitting sub-pixels such as red pixels, blue pixels, green pixels, and white pixels, and can express a full color gamut by combining light from the sub-pixels. Each pixel includes a thin film transistor and at least one field generating electrode connected thereto.

When the display device employs a glass substrate that is heavy and easily broken, there are limitations in its portability and ability to implement a cost-effective large-scale screen display. Hence, OLED displays use at least one flexible substrate as the base substrate because they are lightweight, resistant to impact, and flexible. The flexible substrate is typically formed of a plastic material such as polyimide.

Flexible substrates are very thin and have good flexible characteristics, but they can be easily damaged during manufacturing of the display device. Therefore, the flexible substrate undergoes a thin film transistor process while attached to a carrier substrate, and the carrier substrate is then separated from the flexible substrate. In this case, a sacrificial layer for easily separating the carrier substrate from the display device can be used during the process for manufacturing process.

However, the process for thin film coating the flexible substrate or for bonding the carrier substrate and the flexible substrate, applies heat (thermal treatment), which increases manufacturing time and production costs. Further, the flexible substrate can be deformed by a heat expansion coefficient difference between the carrier substrate and the flexible substrate during the heat treatment.

The above information disclosed in this Background section is only to enhance the understanding of the background of the described technology and therefore it can contain information that does not constitute the prior art that is already known in this country to a person of ordinary skill in the art.

SUMMARY OF CERTAIN INVENTIVE ASPECTS

One inventive aspect relates to simplifying a process for manufacturing a display device and reducing material costs by minimizing a number of flexible substrates used for a manufacturing process of a display device or removing the same.

Another aspect is preventing a sacrificial layer for separating a carrier substrate used during a process for manufacturing a display device from being damaged before a process for separating the carrier substrate.

Another aspect is a method for manufacturing a display device that includes: forming a sacrificial layer on a carrier substrate; forming a passivation barrier layer for covering an upper side and a lateral side of the sacrificial layer on the sacrificial layer and the carrier substrate; forming a thin film transistor layer on the passivation barrier layer; exposing an edge portion of the passivation barrier layer by arranging a mask on the carrier substrate on which the thin film transistor layer is formed; forming a barrier layer by removing an edge portion of the passivation barrier layer that is not covered by the mask; and separating the carrier substrate from the barrier layer via the sacrificial layer The sacrificial layer can include at least one of a metal oxide and a graphene oxide, the metal oxide including at least one of oxide molybdenum (MoOx), aluminum oxide (AlOx), and oxide titanium (TiOx).

The passivation barrier layer can include at least one of silicon nitride (SiNx), silicon oxide (SiOx), or silicon oxynitride (SiOxNy).

The edge portion of the passivation barrier layer can include a portion covering a lateral side of an edge portion of the sacrificial layer and an upper side of the carrier substrate.

The method can further include forming an encapsulator on the thin film transistor layer, wherein the edge portion of the passivation barrier layer includes a portion that does not overlap the encapsulator.

The method can further include forming a light-emitting element layer provided between the thin film transistor layer and the encapsulator, wherein the encapsulator encapsulates the light-emitting element layer.

The separating of the carrier substrate from the barrier layer can include irradiating a laser beam to the sacrificial layer.

The separating of the carrier substrate from the barrier layer can include etching the sacrificial layer with an etchant and removing the same.

The forming of the sacrificial layer can include depositing a metal or a graphene on the carrier substrate by sputtering, and oxidizing the deposited metal or graphene.

A thickness of the sacrificial layer can be equal to or less than about 3000 Å.

The mask can include a shadow mask.

The method can further include attaching a lower substrate to a lower side of the barrier layer after the carrier substrate is separated.

The lower substrate can be flexible.

An edge of the barrier layer can be provided on an upper side of the sacrificial layer.

Another aspect is a display device including: a lower substrate; at least one barrier layer provided on the lower substrate; a thin film transistor layer provided on the barrier layer; and a residual sacrificial layer provided between the barrier layer and the lower substrate, the residual sacrificial layer including at least one of a metal oxide and graphene oxide, and/or a reduction material thereof, the metal oxide including at least one of oxide molybdenum (MoOx), aluminum oxide (AlOx), and oxide titanium (TiOx).

The barrier layer can include at least one of silicon nitride (SiNx), silicon oxide (SiOx), and silicon oxynitride (SiOxNy).

The display device can further include a light-emitting element layer provided on the thin film transistor layer, and an encapsulator provided on the light-emitting element layer.

An edge of the barrier layer can be disposed to be aligned with an edge of the encapsulator or can be provided outside the edge of the encapsulator.

The residual sacrificial layer can include MoO2 and/or MoO3

The lower substrate can be flexible.

Another aspect is a method of manufacturing a display device, comprising: forming a sacrificial layer over a carrier substrate; forming a passivation barrier layer to cover upper and lateral sides of the sacrificial layer; forming a thin film transistor layer over the passivation barrier layer; placing a mask over the thin film transistor layer so as to expose an edge portion of the passivation barrier layer, wherein the edge portion does not overlap the mask in the depth dimension of the display device; removing the edge portion of the passivation barrier layer so as to form a barrier layer; and separating the carrier substrate from the barrier layer via the sacrificial layer.

In the above method, the sacrificial layer is formed of at least one of a metal oxide and a graphene oxide, and wherein the metal oxide includes at least one of oxide molybdenum (MoOx), aluminum oxide (AlOx), and oxide titanium (TiOx). In the above method, the passivation barrier layer is formed of at least one of silicon nitride (SiNx), silicon oxide (SiOx), and silicon oxynitride (SiOxNy). In the above method, the edge portion of the passivation barrier layer includes a portion covering a lateral side of an edge portion of the sacrificial layer and an upper side of the carrier substrate. The above method further comprises forming an encapsulator over the thin film transistor layer, wherein the edge portion of the passivation barrier layer does not overlap the encapsulator in the depth dimension of the display device.

The above method further comprises forming a light-emitting element layer between the thin film transistor layer and the encapsulator, wherein the encapsulator encapsulates the light-emitting element layer. In the above method, the separating includes irradiating a laser beam onto the sacrificial layer. In the above method, the separating includes etching the sacrificial layer with an etchant and removing the sacrificial layer. In the above method, the forming of the sacrificial layer includes: depositing a metal or a graphene onto the carrier substrate through sputtering; and oxidizing the deposited metal or graphene.

In the above method, the thickness of the sacrificial layer is substantially equal to or less than about 3000 Å. In the above method, the mask includes a shadow mask. The above method further comprises attaching a lower substrate to a lower side of the barrier layer after the carrier substrate is separated. In the above method, the lower substrate is flexible. In the above method, an edge of the barrier layer is formed on an upper side of the sacrificial layer.

Another aspect is a display device, comprising: a lower substrate; at least one barrier layer formed over the lower substrate; a thin film transistor layer formed over the barrier layer; and a sacrificial layer interposed between the barrier layer and the lower substrate, wherein the sacrificial layer is formed of at least one of a metal oxide and graphene oxide, and/or a reduction material thereof, and wherein the metal oxide includes at least one of oxide molybdenum (MoOx), aluminum oxide (AlOx), and oxide titanium (TiOx).

In the above display device, the barrier layer is formed of at least one of silicon nitride (SiNx), silicon oxide (SiOx), and silicon oxynitride (SiOxNy). The above display device further comprises: a light-emitting element layer formed over the thin film transistor layer; and an encapsulator formed over the light-emitting element layer. In the above display device, an edge of the barrier layer is aligned with an edge of the encapsulator or is formed outside the edge of the encapsulator. In the above display device, the sacrificial layer is formed of at least one of MoO2 and MoO3. In the above display device, the lower substrate is flexible.

Another aspect is a method of manufacturing a display device, comprising: forming a sacrificial layer over a carrier substrate having a top surface, wherein the sacrificial layer does not cover a portion of the top surface of the carrier substrate; forming a passivation barrier layer to cover upper and lateral sides of the sacrificial layer, wherein the passivation barrier layer covers the portion of the top surface of the carrier substrate; forming a thin film transistor layer over the passivation barrier layer so as to partially cover the passivation barrier layer, wherein the thin film transistor layer has a width less than that of the sacrificial layer, and wherein the width is defined in a direction perpendicular to the depth dimension of the display device; placing a mask over the thin film transistor layer so as to expose an edge portion of the passivation barrier layer, wherein the edge portion does not overlap the mask in the depth dimension of the display device; and removing the edge portion of the passivation barrier layer so as to form a barrier layer.

In the above method, the width of the barrier layer is greater than that of the thin film transistor layer and less than that of the sacrificial layer.

According to at least one of the disclosed embodiments, the process for manufacturing a display device can be simplified and the material costs can be reduced by minimizing the number of flexible substrates used in the process for manufacturing the display device or removing the same.

Further, the carrier substrate is prevented from being separated during the manufacturing process by preventing the carrier substrate for separating the sacrificial layer used in the manufacturing process of a display device from being damaged before the process for separating the carrier substrate.

DETAILED DESCRIPTION OF CERTAIN INVENTIVE EMBODIMENTS

Figure 1:
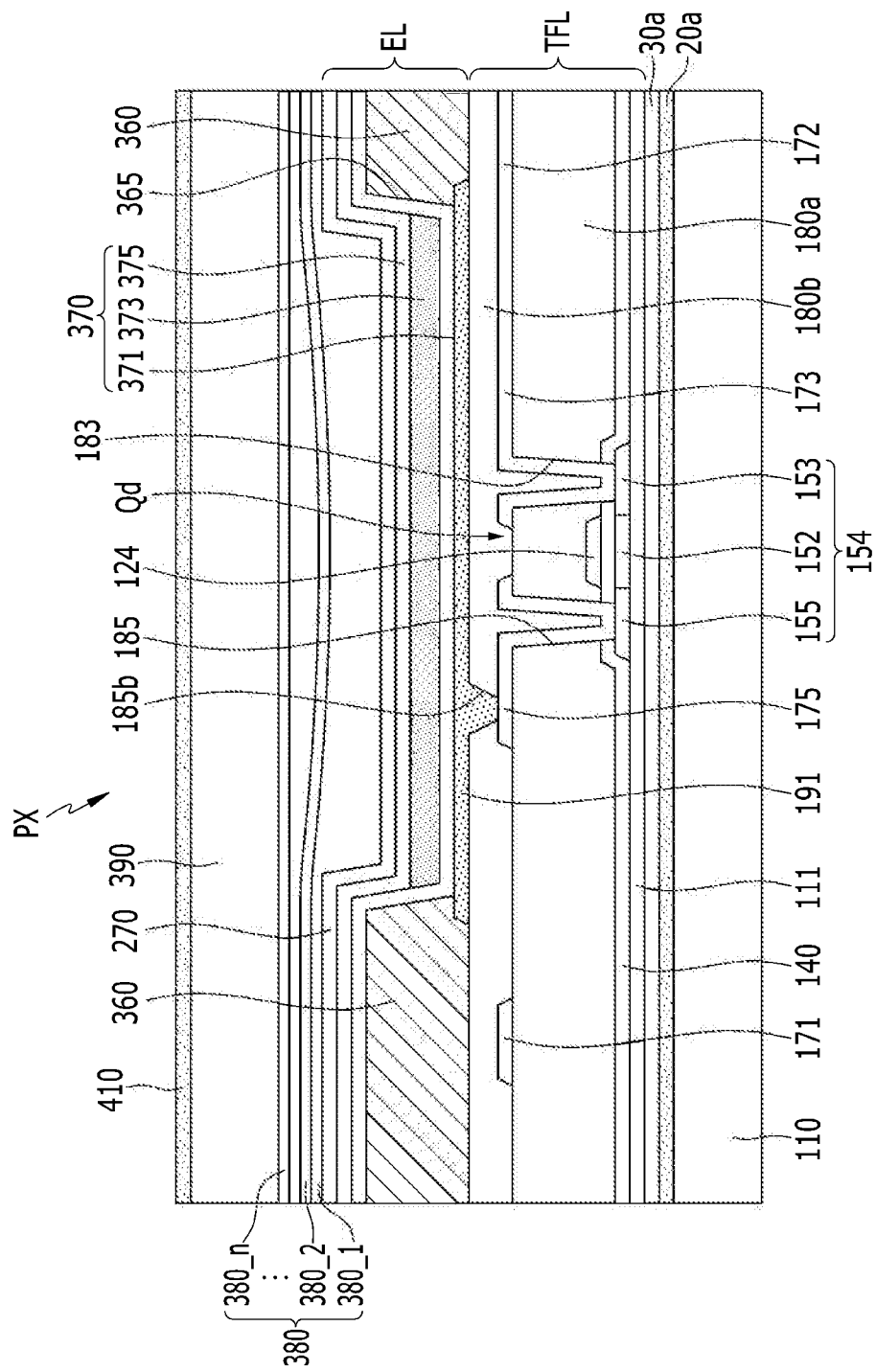
FIG. 1 shows a cross-sectional view of a display device according to an exemplary embodiment.

The described technology will be described more fully hereinafter with reference to the accompanying drawings, in which exemplary embodiments of the invention are shown.

As those skilled in the art would realize, the described embodiments can be modified in various different ways, all without departing from the spirit or scope of the described technology.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements can also be present. In contrast, when an element is referred to as being "directly on" another element, there are no intervening elements present.

Parts that are unrelated to the description of the exemplary embodiments are not shown to make the description clear, and like reference numerals designate like elements throughout the specification.

Throughout this specification and the claims that follow, when it is described that an element is "coupled" to another element, the element can be "directly coupled" to the other element or "electrically coupled" to the other element through a third element. In addition, unless explicitly described to the contrary, the word "comprise" and variations such as "comprises" or "comprising" will be understood to imply the inclusion of stated elements, but not the exclusion of any other elements. In this disclosure, the term "substantially" includes the meanings of completely, almost completely or to any significant degree under some applications and in accordance with those skilled in the art. The term "connected" can include an electrical connection.

A display device according to an exemplary embodiment and a method for manufacturing the same will now be described with reference to accompanying drawings.

A display device according to an exemplary embodiment will now be described with reference to FIG. 1.

FIG. 1 shows a cross-sectional view of a display device according to an exemplary embodiment.

Referring to FIG. 1, the display device includes a display panel (not shown), and the display panel includes a display area for displaying an image and a peripheral area provided near the display area. A matrix of pixels PX and a plurality of display signal lines (not shown) connected to the pixels PX and transmitting a driving signal are provided in the display area.

The display signal lines include a plurality of gate signal lines (not shown) for transmitting a gate signal and a plurality of data lines (not shown) for transmitting a data signal. The gate signal lines and the data lines can extend to cross each other. The display signal lines can extend to the peripheral area to form a pad (not shown).

The pixels PX can be substantially arranged in a matrix form, but the present embodiment is not limited thereto. Each pixel PX can include at least one switching element (not shown) connected to the gate line and the data line, and a pixel electrode (not shown) connected thereto. The switching element can be a three-terminal element such as a thin film transistor integrated on the display panel. The switching element can be turned on or off by the gate signal transmitted by the gate line to selectively transmit the data signal transmitted by the data line to the pixel electrode.

In order to implement a color display, each pixel can display one of the primary colors, and a desired color can be recognized by combining the primary colors. An example of the primary colors can include three primary colors or four primary colors, such as red, green, blue, and the like.

Referring to FIG. 1, the display device according to an exemplary embodiment includes a lower substrate 110. The lower substrate 110 can be formed of glass and plastic. In the case of a flexible display device, the lower substrate 110 can be a film and can be flexible. In this case, the lower substrate 110 can be formed of plastic, such as, polyethylene terephthalate (PET), polyethylene naphthalate (PEN), polycarbonate (PC), polyarylate (PAR), polyetherimide (PEI), polyethersulfone (PES), or polyimide (PI), a metal thin film, or very thin glass At least one barrier layer 30a is provided on the lower substrate 110. The barrier layer 30a can prevent external impurities from being provided to an upper portion through the lower substrate 110. The barrier layer 30a can include at least one of an inorganic layer and an organic layer. For example, the barrier layer 30a is formed of at least one of silicon nitride (SiNx), silicon oxide (SiOx), and silicon oxynitride (SiOxNy).

A residual sacrificial layer 20a can be provided between the lower substrate 110 and the barrier layer 30a. The residual sacrificial layer 20a can be formed of an inorganic material, and for example, at least one metal oxide, such as oxide molybdenum (MoOx), aluminum oxide (AlOx), and oxide titanium (TiOx), and a graphene oxide. For example, when the residual sacrificial layer 20a includes molybdenum, the residual sacrificial layer 20a is formed of MoO2 and/or MoO3. The residual sacrificial layer 20a can also include a reduction material of a material such as the metal oxide or the graphene oxide, for example, a metal such as molybdenum (Mo) and graphene.

In some embodiments, the residual sacrificial layer 20a is not provided.

Although not shown, an adhesive layer can be further provided between the lower substrate 110 and the residual sacrificial layer 20a.

A barrier layer 111 can be provided on the barrier layer 30a. In a like manner as the barrier layer 30a, the barrier layer 111 can prevent external impurities from being provided to an upper portion through the lower substrate 110. The barrier layer 111 can include at least one of an inorganic layer and an organic layer. For example, the barrier layer 111 is formed of at least one of silicon nitride (SiNx), silicon oxide (SiOx), and silicon oxynitride (SiOxNy). The barrier layer 111 can be omitted.

A plurality of semiconductors 154 are provided on the barrier layer 111. The semiconductor 154 can include a channel region 152 and a source region 153, as well as a drain region 155 provided on respective sides of the channel region 152, doped, and formed. The semiconductor 154 can include an amorphous silicon, polysilicon, or oxide semiconductor.

A gate insulating layer 140 formed of silicon nitride (SiNx) or silicon oxide (SiOx) is provided on the semiconductor 154.

A plurality of gate signal lines (not shown) and a plurality of gate conductors including the gate electrode 124 are provided on the gate insulating layer 140. The gate electrode 124 can overlap at least a part of the semiconductor 154, particularly the channel region 152.

A first passivation layer 180a is provided on the gate insulating layer 140 and the gate conductor. The first passivation layer 180a and the gate insulating layer 140 can include a contact hole 183 for exposing a source region 153 of the semiconductor 154 and a contact hole 185 for exposing a drain region 155.

A plurality of data conductors, including a plurality of data lines 171, a plurality of input electrodes 173, and a plurality of output electrodes 175, are provided on the first passivation layer 180a. The data line 171 can transmit a data signal and can cross the scanning signal line. The input electrode 173 is connected to the data line 171. The output electrode 175 is separated from the data line 171. The input electrode 173 faces the output electrode 175 on the semiconductor 154.

The input electrode 173 and the output electrode 175 can be connected to the source region 153 and the drain region 155 of the semiconductor 154 through the contact holes 183 and 185.

The gate electrode 124, the input electrode 173, and the output electrode 175 configure a driving thin film transistor Qd with the semiconductor 154. The configuration of the driving thin film transistor Qd is not limited to the above description and can be modified in various ways.

A second passivation layer 180b can be provided on the data conductor. The second passivation layer 180b can be formed of an inorganic insulator such as silicon nitride or silicon oxide. The second passivation layer 180b can include a contact hole 185b for exposing the output electrode 175.

For convenience, the layers from the barrier layer 111 to the second passivation layer 180b will be referred to as a thin film transistor layer (TFL).

A plurality of pixel electrodes 191 are provided on the second passivation layer 180b.

The pixel electrode 191 of each pixel PX is physically and electrically connected to the output electrode 175 through the contact hole 185b of the second passivation layer 180b. The pixel electrode 191 can be formed of a semi-transmittable conductive material or a reflective conductive material.

A pixel defining layer (also called a partition) 360 can be provided on the second passivation layer 180b. The pixel defining layer 360 includes a plurality of openings for exposing the pixel electrode 191. The opening of the pixel defining layer 360 for exposing the pixel electrode 191 can define a display area for the pixel PX to emit light. The pixel defining layer 360 can be omitted.

An emission member 370 is provided on the pixel defining layer 360 and the pixel electrode 191. The emission member 370 can include a first organic common layer 371, a plurality of emission layers 373, and a second organic common layer 375 that are sequentially deposited.

The first organic common layer 371 can exemplarily include at least one of a hole injecting layer and a hole transport layer that are sequentially deposited. The first organic common layer 371 can be formed over the entire surface of the display area in which the pixels PX are disposed or can be formed in the pixel PX.

The emission layer 373 can be provided on the pixel electrode 191 of the corresponding pixel PX. The emission layer 373 can be formed of an organic material for properly emitting light of the primary colors, such as red, green, and blue, and it can have a configuration in which a plurality of organic material layers for emitting different colors of light are deposited.

The second organic common layer 375 can exemplarily include at least one of the electron transport layer and the electron injecting layer that are sequentially deposited. The second organic common layer 375 can be formed over the entire surface of the display area in which the pixels PX are disposed or it can be formed in each pixel PX.

The first and second organic common layers 371 and 375 are used to improve emission efficiency of the emission layer 373 and one of the first and second organic common layers 371 and 375 can be omitted.

An opposed electrode 270 for transmitting a common voltage is provided on the emission member 370. The opposed electrode 270 can be formed of a transparent conductive material. For example, the opposed electrode 270 is formed of a transparent conductive material or by depositing a thin metal such as calcium (Ca), barium (Ba), magnesium (Mg), aluminum (Al), or silver (Ag) so that it can be photo-transmittable.

The pixel electrode 191, the emission member 370, and the opposed electrode 270 of the pixel PX configure a light-emitting element, one of the pixel electrodes 191 and the opposed electrode 270 is a cathode, and the other is an anode.

For convenience, the layers from the pixel defining layer 360 and the pixel electrode 191 to the opposed electrode 270 are referred to as a light-emitting element layer (EL).

The display device according to an exemplary embodiment can be a top emission type for outputting light provided by the emission member 370 in an upper direction and displaying an image.

An encapsulator 380 is provided on the opposed electrode 270. The encapsulator 380 can prevent permeation of moisture and/or oxygen from the outside by encapsulating the light-emitting element layer (EL), i.e., the emission member 370 and the opposed electrode 270.

The encapsulator 380 can include a plurality of encapsulating thin film layers (380_1, 380_2, 380_3, . . . 380_n). The encapsulating thin film layers (380_1, 380_2, 380_3, . . . 380_n) include at least one inorganic layer and at least one organic layer, which can be alternately deposited. The organic layer is formed of an organic material and can have a planarization characteristic. The inorganic layer can be formed of an inorganic material such as oxide aluminum (AlOx), silicon oxide (SiOx), or silicon nitride (SiNx).

Figure 2:
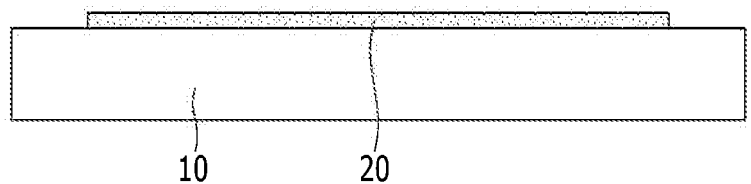
FIGS. 2, 3, 4, 5, 6, 7 and 8 show cross-sectional views of a plurality of processes of a method for manufacturing a display device according to an exemplary embodiment.

Referring to FIG. 2, the encapsulating thin film layer 380_1 provided at the lowest position among the encapsulating thin film layers (380_1, 380_2, 380_3, . . . 380_n) can be an inorganic layer or an organic layer. The encapsulating thin film layer 380_n provided at the highest position among the encapsulating thin film layers (380_1, 380_2, 380_3, . . . 380_n) can be an inorganic layer or an organic layer. The encapsulating thin film layer 380_n provided at the highest position can prevent permeation well toward the encapsulator 380 when it is an inorganic layer.

An edge of the barrier layer 30a can be provided outside the edge of the encapsulator 380 or can be substantially aligned with the edge of the encapsulator 380.

A plurality of patterns can be provided on the encapsulator 380. A plurality of patterns can exemplarily include a touch electrode 410 for sensing a touch.

In the present exemplary embodiment, the OLED display has been described as the display device, but the display device according to an exemplary embodiment is not limited thereto. The display device can be one of various kinds of display devices, such as a liquid crystal display, and in this case, the thin film transistor layer (TFL) and the light-emitting element layer (EL) can have different configurations depending on the respective display devices.

A method for manufacturing a display device according to an exemplary embodiment will now be described with reference to FIG. 1 and FIG. 2 to FIG. 8.

FIG. 2 to FIG. 8 show cross-sectional views of a plurality of processes of a method for manufacturing a display device according to an exemplary embodiment.

Referring to FIG. 2, a carrier substrate 10 is formed of a material that is hard and resists heat. For example, the carrier substrate 10 is formed of quartz glass or heat-resistant glass. A heat-resistant temperature of the carrier substrate 10 can be greater than a maximum temperature in a process for manufacturing a thin film transistor. Laser transmittance of the carrier substrate 10 can be greater than about 50%.

A sacrificial layer 20 is formed on the carrier substrate 10. The sacrificial layer 20 can include a metal oxide such as oxide molybdenum (MoOx), aluminum oxide (AlOx), or oxide titanium (TiOx), or a graphene oxide. For example, the sacrificial layer 20 is formed by depositing a metal such as molybdenum (Mo) and a graphene on the carrier substrate 10 by sputtering, and then oxidizing the same. When the metal such as molybdenum (Mo) is deposited through sputtering, argon gas (Ar) and oxygen gas ($O_2$) can be used. A volume ratio of argon gas (Ar) and oxygen gas $O_2$ can be about 1:2, a sputtering setting temperature can be about 150° C., and the actual temperature in a sputtering chamber can be greater than about 80° C. A sputtering condition for forming the sacrificial layer 20 is not limited thereto.

The sacrificial layer 20 can be equal to or less than about 3,000 Å thick, but is not limited thereto.

Figure 3:
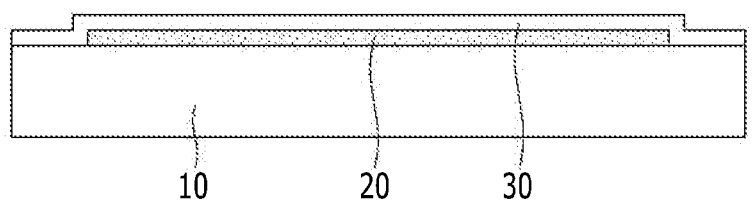

Referring to FIG. 3, a passivation barrier layer 30 for covering the sacrificial layer 20 is formed on the sacrificial layer 20 and the carrier substrate 10. In some embodiments, the passivation barrier layer 30 can cover an upper side and a lower portion of the sacrificial layer 20 so that it is not exposed. The passivation barrier layer 30 can include at least one of an inorganic material and an organic material. For example, the passivation barrier layer 30 is formed of silicon nitride (SiNx), silicon oxide (SiOx), and silicon oxynitride (SiOxNy).

When the sacrificial layer 20 contacts an etchant of gas or liquid used in a process for manufacturing a thin film transistor layer (TFL) or an impurity such as plasma gas, the sacrificial layer 20 can be reduced. For example, when a material including hydrogen (H), such as water ($H_2O$) and hydrogen gas ($H_2$), or an impurity, such as an acid-based etchant, contacts the sacrificial layer 20, the sacrificial layer 20 is reduced and damaged and the carrier substrate 10 provided below the sacrificial layer 20 can be separated. However, when the sacrificial layer 20 is covered with the passivation barrier layer 30 and a subsequent process is performed according to an exemplary embodiment, the sacrificial layer 20 can be prevented from contacting the material including hydrogen (H), such as water ($H_2O$) and hydrogen gas ($H_2$), and the impurity, such as the acid-based etchant, thereby preventing the sacrificial layer 20 from being damaged and the carrier substrate 10 from being separated in advance in the manufacturing process prior to the stage for separating the carrier substrate 10.

Figure 4:
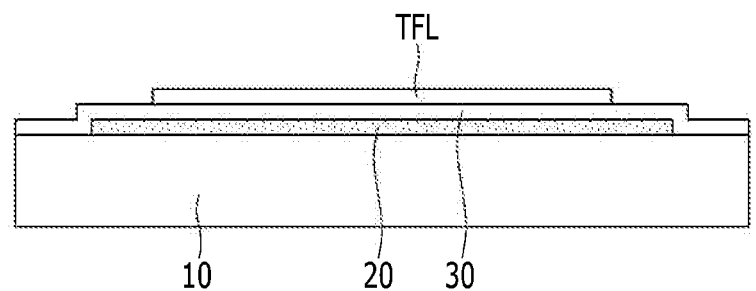

Referring to FIG. 4, a thin film transistor layer (TFL) is formed by depositing a plurality of thin films on the passivation barrier layer 30. The thin film transistor layer (TFL) can include a plurality of thin film transistors and at least one insulating layer. For example, referring to FIG. 1, the thin film transistor layer (TFL) may include a barrier layer 111 as previously described, a plurality of semiconductors 154 (though FIG. 1 shows only a semiconductor for simplicity), a gate insulating layer 140, gate conductors including a plurality of gate electrodes 124 (though FIG. 1 shows only a gate electrode for simplicity), a first passivation layer 180*a*, a plurality of data lines 171 (though FIG. 1 shows only a data line for simplicity), data conductors including a plurality of input electrodes 173 and a plurality of output electrodes 175, and a second passivation layer 180*b* that are sequentially provided upward. The exemplary constituent elements have been previously described, thus no detailed descriptions will be provided here.

Figure 5:
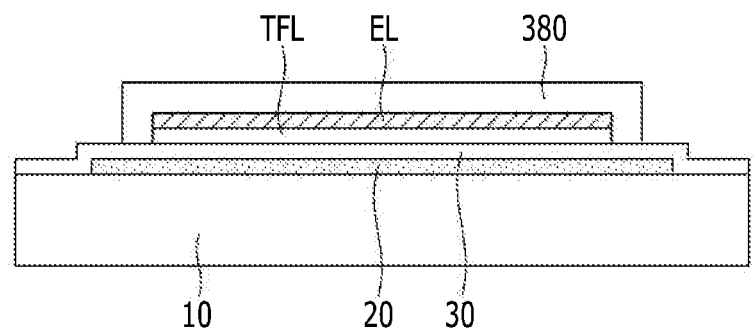

Referring to FIG. 5, a light-emitting element layer (EL) is formed on the thin film transistor layer (TFL). For example, referring to FIG. 1, the light-emitting element layer (EL) may include a plurality of pixel electrodes 191 (though FIG. 1 shows only a pixel electrode corresponding to a pixel PX for simplicity), a pixel defining layer 360, an emission member 370, and an opposed electrode 270 that are sequentially provided upward. The exemplary constituent elements have been previously described, thus no detailed descriptions will be provided here. The formation of the light-emitting element layer (EL) can be omitted, and another process can be added for a different type of display device.

An encapsulator 380 can be formed on the light-emitting element layer (EL). The encapsulator 380 can be formed by alternately depositing the organic material layer and the inorganic material layer. A detailed example of the encapsulator 380 has been described, thus no detailed description thereof will be provided. The formation of the encapsulator 380 can be omitted, and another process can be added for a different type of display device.

Figure 6:
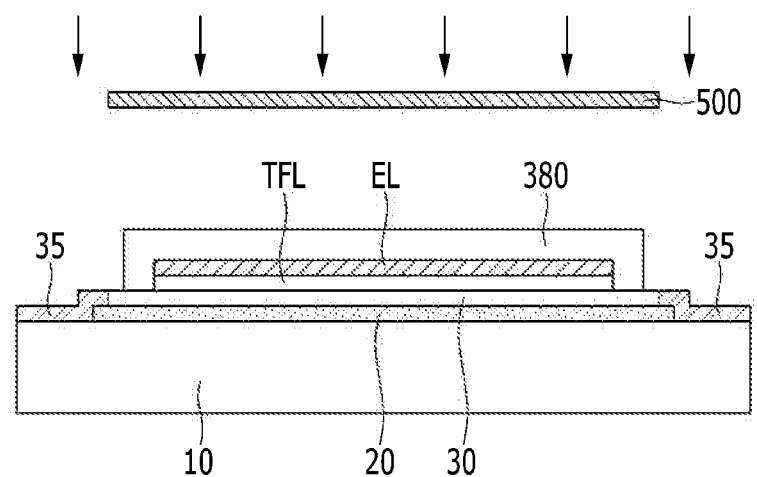

Referring to FIG. 6, a mask 500 is arranged on the carrier substrate 10 on which the thin film transistor layer (TFL) is formed to expose an edge portion 35 of the passivation barrier layer 30. The mask 500 can be separated from the carrier substrate 10 by a predetermined distance, and can include an opening for exposing the edge portion 35 of the passivation barrier layer 30.

The edge portion 35 of the passivation barrier layer 30 not covered by the mask 500 can be formed along an edge of the carrier substrate 10, and can include a side of the edge portion of the sacrificial layer 20 and a portion for covering an upper side of the carrier substrate 10. The side of the edge portion of the sacrificial layer 20 can signify a surface of a portion connected to an upper side of the carrier substrate 10.

The edge portion 35 of the passivation barrier layer 30 not covered by the mask 500 can include a portion not covered by the encapsulator 380 and not overlapping the encapsulator 380. The mask 500 can cover the encapsulator 380. An edge of the mask 500 can be substantially aligned with the edge of the encapsulator 380.

The edge portion 35 of the passivation barrier layer 30 not covered by the mask 500 is removed. In this case, the edge portion 35 of the passivation barrier layer 30 can be removed by dry etching. Dry etching gas can use various types of conventionally known gasses and the edge portion 35 of the passivation barrier layer 30 not covered by the mask 500 can be removed by dry etching.

The mask 500 can be a shadow mask having an opening, and a portion covered by the mask 500 can be covered so that dry etching gas does not reach the same.

Figure 7:
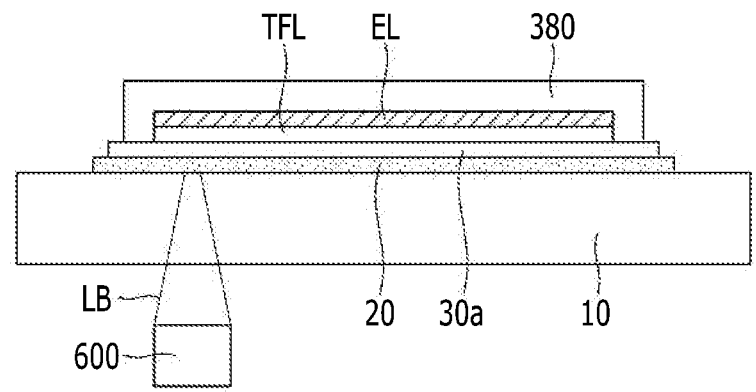

Referring to FIG. 7, the edge portion 35 of the passivation barrier layer 30 is removed to form a barrier layer 30*a*. An edge of the barrier layer 30*a* can be provided outside the edge of the encapsulator 380 or can be substantially aligned with the edge of the encapsulator 380. The edge of the barrier layer 30*a* can also be provided on an upper side of the sacrificial layer 20.

The carrier substrate 10 is separated from the barrier layer 30*a* through the sacrificial layer 20. Here, the sacrificial layer 20 can be damaged, and there can be many methods for separating the carrier substrate 10 depending on the damage.

For example, as shown in FIG. 7, the carrier substrate 10 is attached or detached by irradiating a laser beam (LB) provided by a laser beam device 600 to the sacrificial layer 20. The laser beam (LB) is transmitted through the carrier substrate 10 and is irradiated to the sacrificial layer 20. A source of the laser beam (LB) can exemplarily be one of excimer laser beam with a wavelength of about 308 nm, Yb:YAG laser beam with a wavelength of about 343 nm, Nd:YAG laser beam with a wavelength of about 355 nm, and green laser beam with a wavelength of about 532 nm, but the present embodiment is not limited thereto. The excimer laser beam does not damage the carrier substrate 10 and the thin film transistor layer (TFL) but outputs high energy with a short wavelength so the sacrificial layer 20 can be removed in a short time.

Part of the sacrificial layer 20 can remain on the upper side of the separated carrier substrate 10, and can also remain on the lower side of the separated barrier layer 30a. The sacrificial layer 20 remaining on the lower side of the barrier layer 30a will be referred to as a residual sacrificial layer 20a. The residual sacrificial layer 20a can include a material for configuring the sacrificial layer 20 and/or a reduced material thereof. For example, when the sacrificial layer 20 includes oxide molybdenum (MoOx), the residual sacrificial layer 20a includes MoO2 and/or MoO3.

The residual sacrificial layer 20a can be removed or remain in a subsequent stage.

To separate the carrier substrate 10, a method that is different from the method for using a laser beam can be used.

Figure 8:
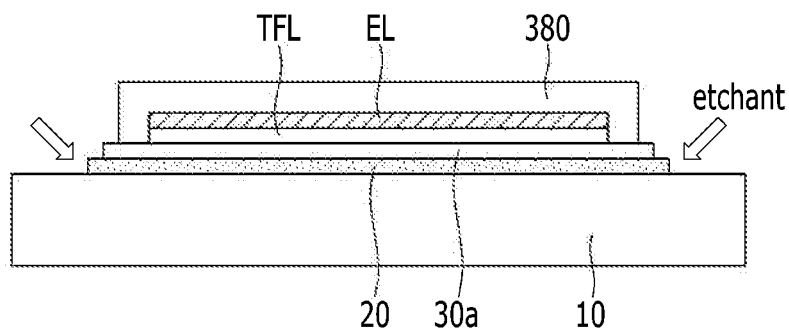

For example, referring to FIG. 8, the carrier substrate 10 is separated by rinsing or etching the sacrificial layer 20 exposed by removing the edge portion 35 of the passivation barrier layer 30. An etchant for rinsing or etching the sacrificial layer 20 can melt or reduce the material configuring the sacrificial layer 20. For example, the etchant includes an etchant based on an acid such as water (H2O) or hydrogen fluoride (HF). In this case, part of the sacrificial layer 20 can remain on the upper side of the carrier substrate 10 and can remain on the lower side of the barrier layer 30a. The sacrificial layer 20 remaining on the lower side of the barrier layer 30a will be referred to as a residual sacrificial layer 20a.

Referring to FIG. 1, the lower substrate 110 including various types of plastic, such as, polyethylene terephthalate (PET), polyethylene naphthalate (PEN), polycarbonate (PC), polyarylate (PAR), polyetherimide (PEI), polyethersulfone (PES), or polyimide (PI), a metal thin film, or very thin glass is attached to the lower side of the residual sacrificial layer 20a or the barrier layer 30a to finish the display device.

According to the exemplary embodiment, the sacrificial layer 20 for separating the carrier substrate 10 is covered by the passivation barrier layer 30 so that it does not get damaged during the process for manufacturing a display device, thereby preventing the carrier substrate 10 from being separated during the process for manufacturing a display device.

Further, the number of flexible substrates such as the polyimide film (PI) supplied to the process for manufacturing the flexible display device can be minimized or they are not needed, thereby simplifying the process for manufacturing a display device and reducing the material costs.

While the described technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a display device, comprising:
    forming a sacrificial layer over a carrier substrate;
    forming a passivation barrier layer to cover upper and lateral sides of the sacrificial layer;
    forming a thin film transistor layer over the passivation barrier layer;
    placing a mask over the thin film transistor layer so as to expose an edge portion of the passivation barrier layer, wherein the edge portion does not overlap the mask in the depth dimension of the display device;
    removing the edge portion of the passivation barrier layer so as to form a barrier layer; and
    separating the carrier substrate from the barrier layer via the sacrificial layer.

2. The method of claim 1, wherein the sacrificial layer is formed of at least one of a metal oxide and a graphene oxide, and wherein the metal oxide includes at least one of oxide molybdenum (MoOx), aluminum oxide (AlOx), and oxide titanium (TiOx).

3. The method of claim 2, wherein the passivation barrier layer is formed of at least one of silicon nitride (SiNx), silicon oxide (SiOx), and silicon oxynitride (SiOxNy).

4. The method of claim 2, wherein the edge portion of the passivation barrier layer includes a portion covering a lateral side of an edge portion of the sacrificial layer and an upper side of the carrier substrate.

5. The method of claim 4, further comprising forming an encapsulator over the thin film transistor layer, wherein the edge portion of the passivation barrier layer does not overlap the encapsulator in the depth dimension of the display device.

6. The method of claim 5, further comprising forming a light-emitting element layer between the thin film transistor layer and the encapsulator, wherein the encapsulator encapsulates the light-emitting element layer.

7. The method of claim 1, wherein the separating includes irradiating a laser beam onto the sacrificial layer.

8. The method of claim 1, wherein the separating includes etching the sacrificial layer with an etchant and removing the sacrificial layer.

9. The method of claim 1, wherein the forming of the sacrificial layer includes:
    depositing a metal or a graphene onto the carrier substrate through sputtering; and
    oxidizing the deposited metal or graphene.

10. The method of claim 1, wherein the thickness of the sacrificial layer is substantially equal to or less than about 3000 Å.

11. The method of claim 1, wherein the mask includes a shadow mask.

12. The method of claim 1, further comprising attaching a lower substrate to a lower side of the barrier layer after the carrier substrate is separated.

13. The method of claim 12, wherein the lower substrate is flexible.

14. The method of claim 1, wherein an edge of the barrier layer is formed on an upper side of the sacrificial layer.

15. A method of manufacturing a display device, comprising:
    forming a sacrificial layer over a carrier substrate having a top surface, wherein the sacrificial layer does not cover a portion of the top surface of the carrier substrate;
    forming a passivation barrier layer to cover upper and lateral sides of the sacrificial layer, wherein the passivation barrier layer covers the portion of the top surface of the carrier substrate;
    forming a thin film transistor layer over the passivation barrier layer so as to partially cover the passivation barrier layer, wherein the thin film transistor layer has a width less than that of the sacrificial layer, and wherein the width is defined in a direction perpendicular to the depth dimension of the display device;

placing a mask over the thin film transistor layer so as to expose an edge portion of the passivation barrier layer, wherein the edge portion does not overlap the mask in the depth dimension of the display device; and removing the edge portion of the passivation barrier layer so as to form a barrier layer.

16. The method of claim 15, wherein the width of the barrier layer is greater than that of the thin film transistor layer and less than that of the sacrificial layer.

* * * * *